(12) United States Patent
Schmidt et al.

(10) Patent No.: US 10,727,311 B2
(45) Date of Patent: Jul. 28, 2020

(54) METHOD FOR MANUFACTURING A POWER SEMICONDUCTOR DEVICE HAVING A REDUCED OXYGEN CONCENTRATION

(71) Applicant: Infineon Technologies AG, Neubiberg (DE)

(72) Inventors: Gerhard Schmidt, Wernberg-Wudmath (AT); Johannes Konrad Baumgartl, Riegersdorf (AT); Matthias Kuenle, Villach (AT); Erwin Lercher, Villach (AT); Daniel Schloegl, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/050,163

(22) Filed: Jul. 31, 2018

(65) Prior Publication Data

US 2019/0035909 A1 Jan. 31, 2019

(30) Foreign Application Priority Data

Jul. 31, 2017 (DE) .................. 10 2017 117 306

(51) Int. Cl.
| | | |
|---|---|---|
| *H01L 29/66* | (2006.01) | |
| *C30B 25/00* | (2006.01) | |
| *C30B 31/22* | (2006.01) | |
| *C30B 31/02* | (2006.01) | |
| *H01L 21/225* | (2006.01) | |

(Continued)

(52) U.S. Cl.
CPC ...... *H01L 29/66333* (2013.01); *C30B 15/007* (2013.01); *C30B 15/20* (2013.01); *C30B 25/00* (2013.01); *C30B 31/02* (2013.01); *C30B 31/22* (2013.01); *H01L 21/02255* (2013.01); *H01L 21/02293* (2013.01); *H01L 21/02422* (2013.01); *H01L 21/2253* (2013.01); *H01L 21/2255* (2013.01); *C30B 29/06* (2013.01); *H01L 21/02002* (2013.01); *H01L 29/1095* (2013.01); *H01L 29/66348* (2013.01)

(58) Field of Classification Search
CPC ........ H01L 29/66333; H01L 21/02255; H01L 21/02293; H01L 21/02422; H01L 21/2253; H01L 21/2255; H01L 29/1095; H01L 21/02002; C30B 25/00; C30B 31/02; C30B 31/22

See application file for complete search history.

(56) References Cited

U.S. PATENT DOCUMENTS

| | | |
|---|---|---|
| 3,764,411 A | 10/1973 | Brown |
| 6,271,061 B1 | 8/2001 | Frisina et al. |

(Continued)

FOREIGN PATENT DOCUMENTS

DE    2130928 A1    12/1971

*Primary Examiner* — Patricia D Reddington
(74) *Attorney, Agent, or Firm* — Murphy, Bilak & Homiller, PLLC

(57) ABSTRACT

A method for forming a power semiconductor device is provided. The method includes: providing a semiconductor wafer grown by a Czochralski process and having a first side; forming an n-type substrate doping layer in the semiconductor wafer at the first side, the substrate doping layer having a doping concentration of at least $10^{17}/cm^3$; and forming an epitaxy layer on the first side of the semiconductor wafer after forming the n-type substrate doping layer.

19 Claims, 11 Drawing Sheets

(51) Int. Cl.
*C30B 15/00* (2006.01)
*C30B 15/20* (2006.01)
*H01L 21/02* (2006.01)
C30B 29/06 (2006.01)
H01L 29/10 (2006.01)

(56) References Cited

U.S. PATENT DOCUMENTS

2013/0119522 A1* 5/2013 Schmidt ................ H01L 21/223
　　　　　　　　　　　　　　　　　　　　257/655
2017/0207124 A1　　7/2017 Rupp et al.

* cited by examiner

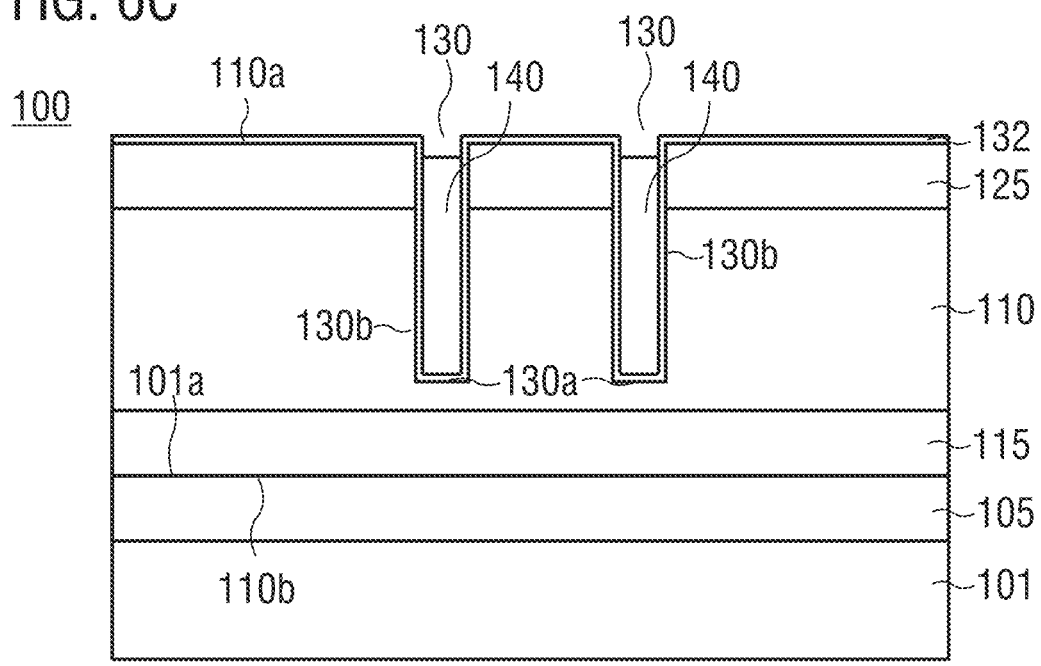
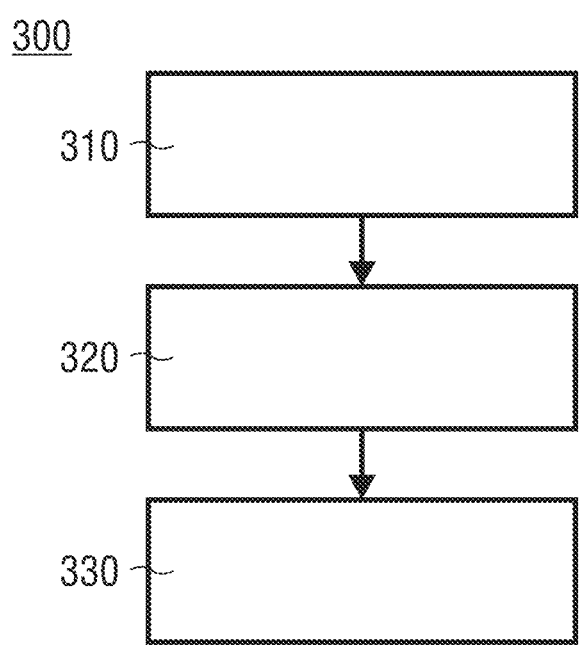

METHOD FOR MANUFACTURING A POWER SEMICONDUCTOR DEVICE HAVING A REDUCED OXYGEN CONCENTRATION

TECHNICAL FIELD

Embodiments described herein relate to methods for manufacturing power semiconductor devices having a reduced oxygen concentration.

BACKGROUND

For manufacturing power devices, so-called float zone semiconductor substrate is used, which is doped during manufacturing of the semiconductor substrate. A cost-efficient alternative are so-called Czochralski semiconductor materials which can be provided as large diameter wafers. FZ substrates are limited to 200 mm. Semiconductor material manufactured by using the Czochralski process exhibit a high concentration of oxygen which diffuses in the material during manufacturing. FZ materials have a much lower oxygen concentration.

Interstitial oxygen may act as unwanted doping centres or influences the diffusion of dopants. It is therefore desire to have a cost-efficient semiconductor material with a low oxygen concentration.

In view of the above, there is a need for improvement.

SUMMARY

According to an embodiment, a method for forming a power semiconductor device is provided. The method includes: providing a semiconductor wafer grown by a Czochralski process and having a first side; forming a n-type substrate doping layer in the semiconductor wafer at the first side, the substrate doping layer having a doping concentration of at least $10^{17}/cm^3$, typically of at least $10^{18}/cm$; and forming an epitaxy layer on the first side of the semiconductor wafer after forming the substrate doping layer.

According to an embodiment, a power semiconductor device is provided. The power semiconductor device includes: an epitaxy layer having a first side and a second side, wherein at least one pn-junction is formed in the epitaxy layer, and a dopant layer of a first conductivity type formed in the epitaxy layer at the second side, wherein the dopant layer has a doping concentration of at least $10^{17}/cm^3$, typically of at least $10^{18}/cm^3$, wherein an oxygen concentration in the epitaxy layer declines, at least in portions, exponentially from the dopant layer at the second side to the first side.

Those skilled in the art will recognise additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference signs designate corresponding parts. In the drawings:

FIGS. 6A to 6C illustrate, in a cross-sectional view of a semiconductor substrate, processes according to embodiments;

FIG. 7 illustrates a flow chart of a method according to embodiments;

DETAILED DESCRIPTION

Figure 1:
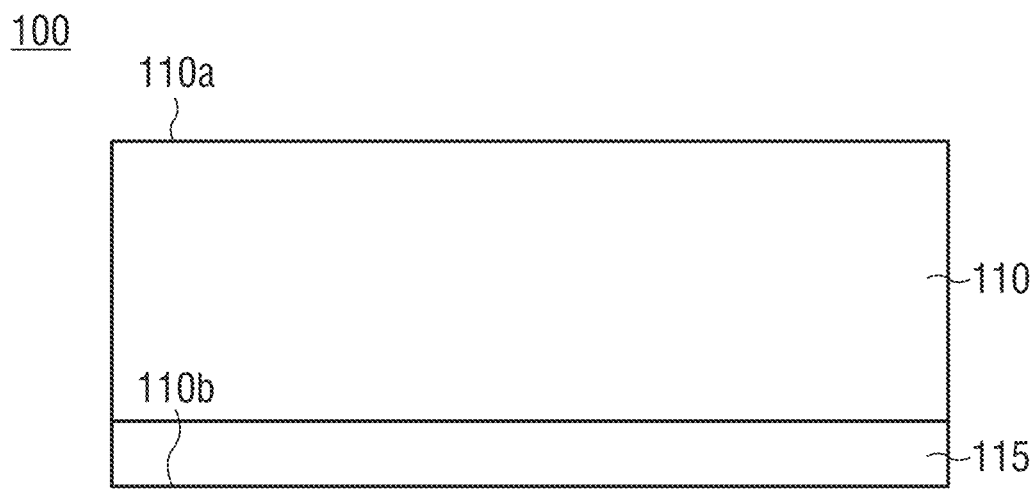
FIG. 1 illustrates a power semiconductor device according to embodiments.

In the following Detailed Description, reference is made to the accompanying drawings, which form a part hereof, and in which are shown by way of illustration specific embodiments in which the invention may be practiced. In this regard, directional terminology, such as "top", "bottom", "front", "back", leading", "trailing", "lateral", "vertical" etc., is used with reference to the orientation of the Figure(s) being described. These terms are intended to encompass different orientations of the device in addition to different orientations than those depicted in the figures. Because components of embodiments can be positioned in a number of different orientations, the directional terminology is used for purpose of illustration and is in no way limiting. Further, terms such as "first", "second", and the like, are also used to describe various elements, regions, sections, etc. and are also not intended to be limiting. Like terms refer to like elements throughout the description. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

In this specification, a second surface of a semiconductor substrate is considered to be formed by the lower or backside surface while a first surface is considered to be formed by the upper, front or main surface of the semiconductor substrate. The terms "above" and "below" as used in this specification therefore describe a relative location of a structural feature to another structural feature with consideration of this orientation.

The terms "electrical connection" and "electrically connected" describes an ohmic connection between two elements.

Some embodiments are described next with reference to the Figures. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

The embodiments illustrated in the Figures mainly pertain to power semiconductor devices without being limited thereto. The power semiconductor devices typically includes a first major electrode on an upper or first side of a semiconductor substrate and a second major electrode on lower or second side of the semiconductor substrate. A current path is defined between the first major electrode and the second major electrode, which current path extend across at least one pn-junction formed in the semiconductor substrate between the first side and the second side. The current path can be controllable through a control electrode which is also referred to as gate electrode.

An embodiment is described next with reference to FIG. 1.

FIG. 1 shows a power semiconductor device 100. For instance, the power semiconductor device 100 can be an insulated-gate bipolar transistor (IGBT), a diode, such as a free-wheeling diode, or the like. According to embodiments, the power semiconductor device 100 can be rated for a voltage of equal to or more than 100 V and/or equal to or less than 1200 V.

The power semiconductor device 100 includes an epitaxy layer 110 having a first side 110*a* and a second side 110*b*, wherein at least one pn-junction is formed in the epitaxy layer 110. A dopant layer 115 of a first conductivity type can be formed in the epitaxy layer 110 at the second side 110*b*. The dopant layer can have at least one dopant of the first conductivity type with a dopant concentration above impurity level. Specifically, the dopant layer 115 can have a doping concentration of at least $10^{17}/cm^3$, typically of at least $10^{18}/cm^3$. The dopant of the first conductivity type can be an n-type dopant, such as a group V material. For instance, the dopant can contain phosphorus. Specifically, one of the at least on dopant can be phosphorus. According to embodiments, the dopant layer can include one only dopant, for example phosphorus.

In addition to the dopant concentration of the dopant of the first conductivity type, the epitaxy layer 110 can include oxygen having an oxygen concentration, i.e. a concentration of oxygen in the epitaxy layer 110. Specifically, the oxygen concentration in the epitaxy layer 110 can decline, at least in portions, exponentially from the dopant layer 115 at the second side 110*b* to the first side 110*a*.

Figure 2A:
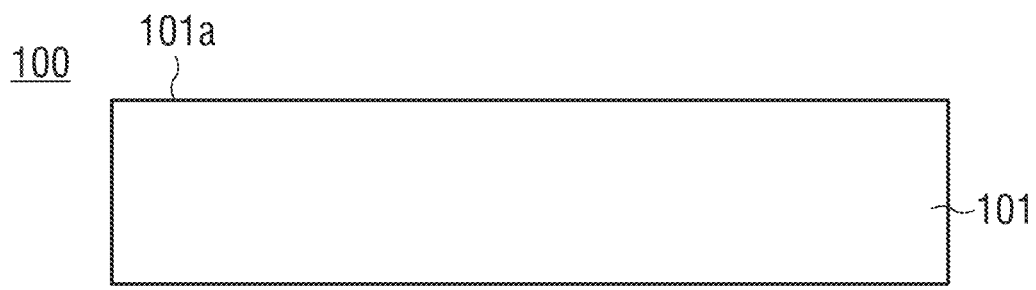
FIGS. 2A to 2C illustrate, in a cross-sectional view of a semiconductorsubstrate, processes according to embodiments.
Figure 2B:
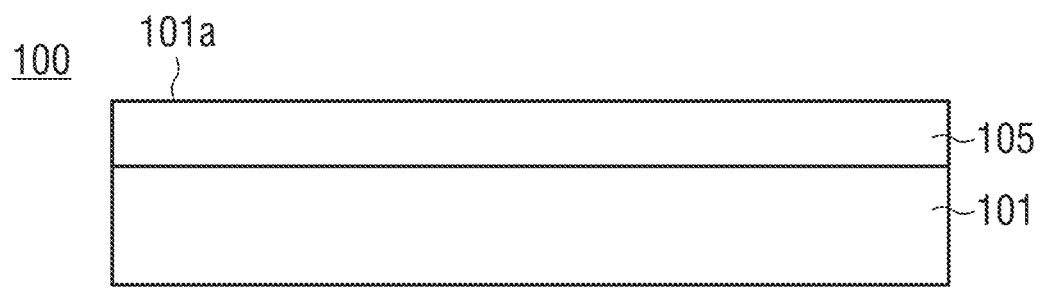
Figure 2C:
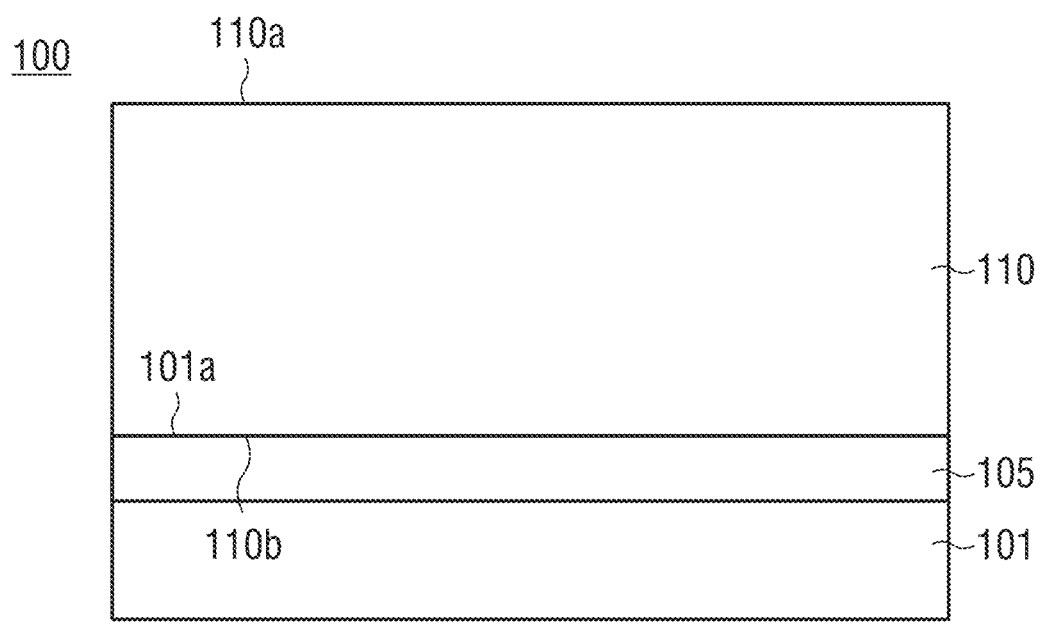

FIGS. 2A to 2C illustrate, in a cross-sectional view of a semiconductor substrate 101, processes according to embodiments. Specifically, FIG. 2A to 2C shows different stages of a method for forming the power semiconductor device 100.

As shown in FIG. 2A, a semiconductor wafer 101 grown by a Czochralski process can be provided. The semiconductor wafer 101 can include a first side 101*a*. Further, the semiconductor wafer 101 can include a second side opposite to the first side 101*a*.

In the context of the present disclosure, a Czochralski process, such as a Czochralski process for growing the semiconductor wafer 101, can be considered as a method of crystal growth used to obtain single crystals of semiconductors (e.g. silicon, germanium and gallium arsenide). In particular, a Czochralski process for growing a silicon (Si) can be used. In a Czochralski process, a semiconductor wafer 101 having a diameter of 300 mm or more can be grown. In particular, by using a Czochralski process, semiconductor wafers having a larger diameter than in other processes, such as a Float Zone process, can be grown.

On the other hand, a semiconductor wafer 101 grown by a Czochralski process typically includes a higher impurity concentration of oxygen, nitrogen and/or carbon. In case of a magnetic Czochralski process, the incorporation of oxygen can be reduced by applying a magnetic field during pulling. However, compared to a semiconductor wafer formed by a Float Zone process, a semiconductor wafer grown by a magnetic Czochralski process still has a significant higher concentration of oxygen. In the context of the present disclosure, an oxygen concentration can specifically referred to a concentration of interstitial oxygen.

Specifically, a semiconductor wafer grown by a Float Zone process can have an oxygen concentration of less than $1 \cdot 10^{16}$ cm$^{-3}$, whereas a semiconductor wafer grown by a Czochralski process can have an oxygen concentration being two magnitudes larger, i.e. of $1 \cdot 10^{17}$ cm$^{-3}$ and $1 \cdot 10^{18}$ cm$^{-3}$. For the simplest and less expensive Czochralski material, the oxygen concentration can even be larger than $1 \cdot 10^{18}$ cm$^{-3}$. The oxygen, specifically the interstitial oxygen, tends to form thermal donators in a temperature range from 300° C. to 550° C. due to an interaction with point defects in the semiconductor, e.g. Si, grid (vacancies, self-interstitials). Here, one may differentiate between deep thermal double donators (TDD), which can be considered as oxygen complexes and can have three or more oxygen atoms, and shallow thermal donators (STDH), for which's generation additional hydrogen is needed and which are therefore mainly observed after proton irradiation. As proton irradiation is a typical measure performed during back-end-of-line (BEOL) processing, i.e. from the second side of the semiconductor wafer 101 and/or epitaxy layer 110, e.g., for forming the donators for a filed stop of the power semiconductor device 100, a desired dose for the amount of charges in the field stop may only be assured if a concentration of TDD complexes (which may correlate to the oxygen concentration) does not get to high. Further, there may be an interaction with carbon, which may also have an impact on the doping efficiency of the proton irradiation.

To enable a semiconductor wafer grown by a Czochralski process, such as the semiconductor wafer 101, to be used for forming a power semiconductor device, such as the power semiconductor device 100, a diffusion of oxygen from the semiconductor wafer to layers formed on the semiconductor wafer may be reduced.

According to embodiments, an n-type substrate doping layer 105 can be formed in the semiconductor wafer 101 at the first side 101*a* (see e.g. FIG. 2B). The n-type substrate doping layer 105 can have a high doping concentration of an n-type dopant. For instance, the doping layer 105 can have a doping concentration of at least $10^{17}/cm^3$, typically of at least $10^{18}/cm^3$. Further, the doping layer 105 can be a surface layer, i.e. the doping layer 105 may have a small thickness.

The substrate doping layer 105 can have a retarding effect on the oxygen diffusion from the semiconductor wafer 101 to a layer formed on the substrate doping layer 105. In particular, the substrate doping layer 105 may reduce the amount of oxygen that diffuses from the semiconductor wafer 101 to a layer formed on the substrate doping layer 105.

As shown in FIG. 2C, an epitaxy layer 110 can be formed on the first side 101*a* of the semiconductor wafer 101, specifically after forming the substrate doping layer 105. That is, the epitaxy layer 110 can be formed on the substrate doping layer 105. Accordingly, oxygen diffusion from the semiconductor wafer 101 to the epitaxy layer 110 can be reduced. In particular, oxygen diffusion from the semiconductor wafer 101 to the epitaxy layer 110 can be reduced to level being lower than it would occur without the substrate doping layer 105.

In addition, a heat treatment can be carried out before the epitaxy layer 110 is formed. Due to the heat treatment oxygen may diffuse out of the semiconductor wafer 101. Accordingly, the amount of oxygen in the semiconductor wafer 101 may be reduced when the epitaxy layer 110 is formed. Thus, an epitaxy layer 110 having an even lower oxygen amount may be provided. When practicing embodiments, a dose of oxygen diffusing from the semiconductor wafer 101 to the epitaxy layer 110 may be reduced to e.g. $3.5 \cdot 10^{13}$ cm$^{-2}$ using the growth of the epitaxy layer. In particular, the heat treatment may reduce the amount of oxygen diffusing into the epitaxy layer 110 by about 25%. For instance, an epitaxy layer 110 can be provided in which the oxygen concentration reduces from $3 \cdot 10^{17}$ cm$^{-3}$ at the second side 110b to an uncritical value of about $1 \cdot 10^{17}$ cm$^{-3}$ within 1-2 µm.

According to embodiments described herein, the dopant layer 115 of the first conductivity type can be formed in the epitaxy layer 110 during growth of the epitaxy layer 110. Specifically, the dopant layer 115 can be formed by diffusion of dopants of the substrate doping layer 105 into the epitaxy layer 110. Accordingly, the dopant layer 115 may have the same kind of dopants as the substrate doping layer 105. According to embodiments described herein, the dopant layer 115 can have a thickness of equal to or more than 0.5 µm, specifically equal to or more than 0.7 µm, particularly equal to or more than 1.0 µm.

Additionally or alternatively, a heat treatment may also be performed before the substrate doping layer 105 is performed. Thereby, the above-described effect can be further enhanced.

For example, the substrate doping layer 105 may have a high concentration of phosphorus. During growing of the epitaxy layer 110 on the substrate doping layer 105 a portion of the phosphorus dopants may diffuse from the substrate doping layer 105 into the epitaxy layer 110 and may thus form the dopant layer 115 having a high phosphorus concentration than an adjacent portion of the epitaxy layer 110.

According to embodiments described herein, the dopant layer 115 has a higher doping concentration than an adjacent portion of the epitaxy layer 110. Accordingly, the dopant layer 115 can be used as a functional layer of the power semiconductor device 100. For instance, in case of a MOSFET the dopant layer 115 can be used as a drain zone. Further, in case of a diode the dopant layer 115 can be used as a cathode emitter.

Figure 3A:
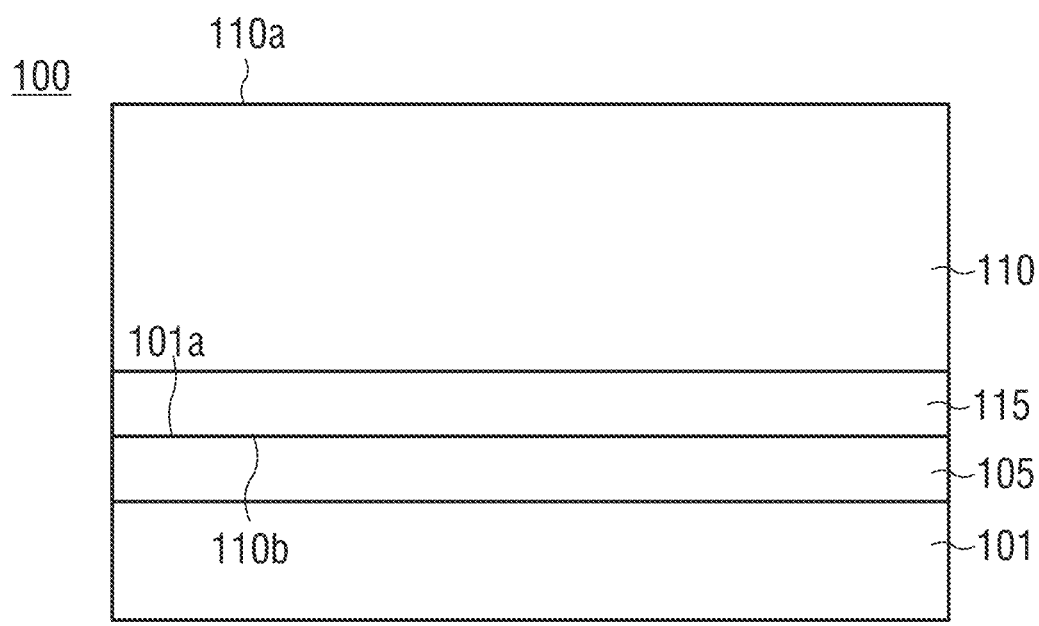
FIGS. 3A and 3B illustrate, in a cross-sectional view of a semiconductor substrate, further processes according to embodiments.
Figure 3B:
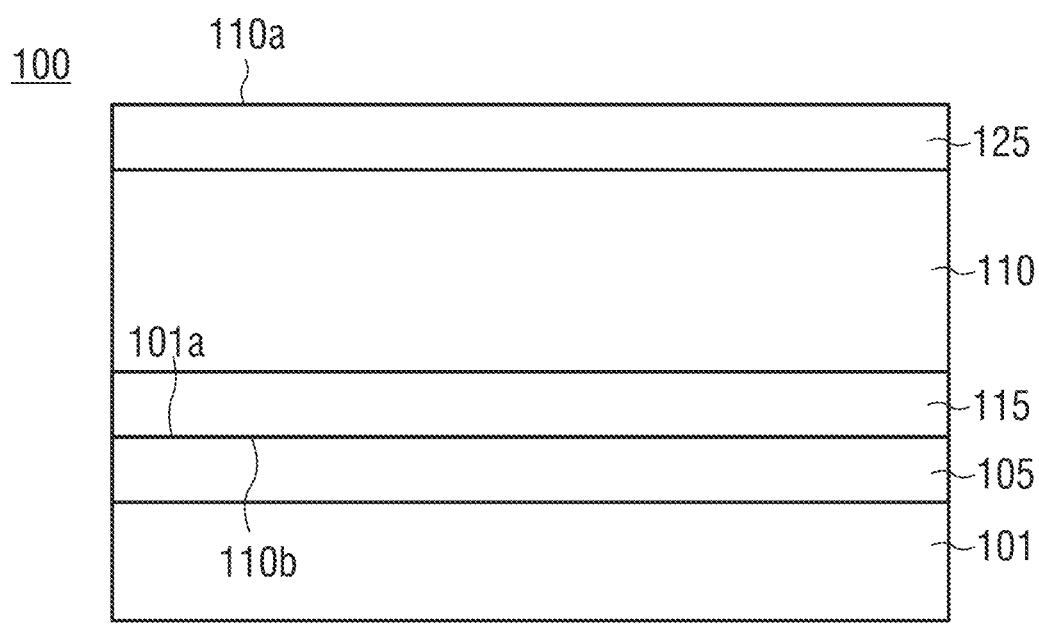

As exemplary illustrated in FIGS. 3A and 3B, the method of forming the power semiconductor device 100 can include one or more front-end-of-line (FEOL) processes, such as forming of pn/np junctions, forming of metallizations, isolations, gate module formation, 5. Source and drain module formation, and the like. FIG. 3A exemplary shows the first side 110a of the epitaxy layer 110.

FIG. 3B exemplary shows formation of an upper dopant layer 125 or doping region 125 from the first side 110a of the epitaxy layer 110. For instance, the upper dopant layer 125 may include dopants of the first conductivity type. That is, the dopant layer 115 and the upper dopant layer 125 can be of the same conductivity type. In particular, the first conductivity type can be n-type. Accordingly, the dopant layer 115 and the upper dopant layer 125 can be n-type layers.

Further, the epitaxy layer 110 can be undoped or can include dopants of a first conductivity type. Accordingly, in case the dopant layer 115 includes n-type dopants, the epitaxy layer 110 may also include n-type dopants. According to embodiments described herein, a pn-junction can be formed in the epitaxy layer 110 between either the background doping of the epitaxy layer 110 and an additional p-type doping layer or between the dopant layer 115 and the additional p-type doping layer.

Furthermore, a np-junction can be formed in the epitaxy layer 110 by forming the upper dopant layer 125. According to embodiments described herein, at least one pn-junction and at least one np-junction can be formed in the epitaxy layer 110. Specifically, an emitter zone can be formed between the second side 110b and the np-junction, a base zone can be formed between the np-junction and the pn-junction, and/or a body zone can be formed between the pn-junction and the first side 110a. For example, the emitter zone may correspond to the additional p-type doping layer and/or the body zone may correspond to the upper dopant layer 125. The base zone, or drift zone, can be the portion of the epitaxy layer 110 between the additional p-type doping layer and the upper dopant layer 125. According to embodiments described herein, the emitter zone can have a thickness of at least 2% of a thickness of the base zone. In particular, the thickness of the emitter zone can be at least in the range of a thickness variation of the base zone.

According to an embodiment, the power semiconductor device is an IGBT having, from the second side 110b to the first side 110a, an emitter zone or region of a second conductivity type such as p-doped, an optional field-stop zone or region of the first conductivity type such as n-doped, a drift zone or region of a first conductivity type, also referred to as base zone, a body zone or region of the second conductivity type, and a source zone or region of the first conductivity type. The field stop zone has a higher doping concentration than the drift zone.

According to an embodiment, the power semiconductor device is a MOSFET having, from the second side 110b to the first side 110a, a drain zone or region of first conductivity type, an optional field-stop zone or region of the first conductivity type, a drift zone or region of a first conductivity type, a body zone or region of the second conductivity type, and a source zone or region of the first conductivity type. The field stop zone has a higher doping concentration than the drift zone.

According to embodiments described herein, although not shown in the figures, a first metallization can be formed on the epitaxy layer 110. Additionally or alternatively, forming a second metallization can be formed on the second side of the semiconductor wafer opposite to the first side 101a. Specifically, the second metallization can be formed without thinning the semiconductor wafer, e.g. on the unthinned semiconductor wafer. Further, the second metallization can be formed after thinning of the semiconductor wafer 101, e.g. after at least partially removing the semiconductor wafer 101.

Figure 4:
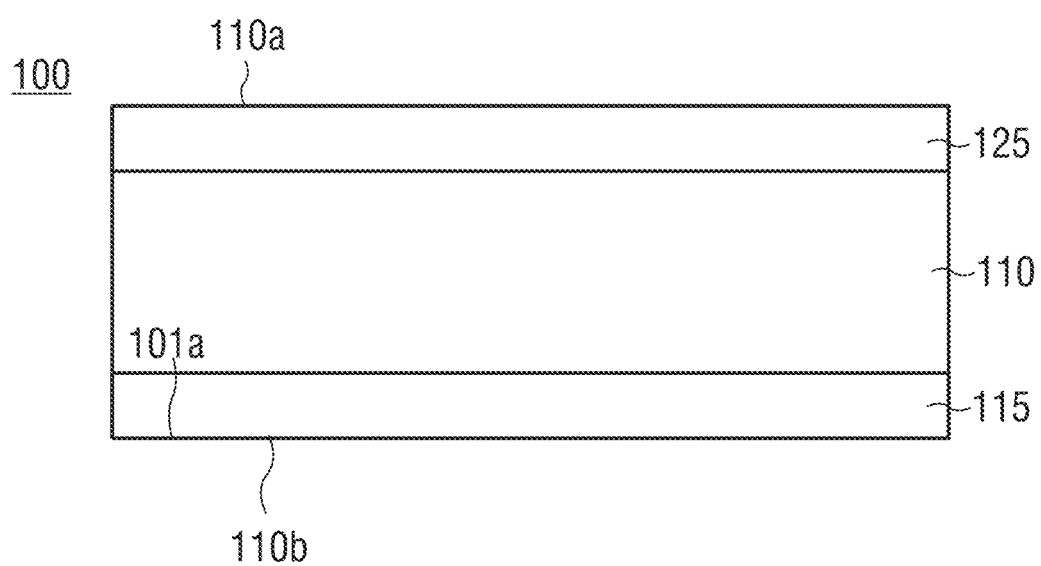
FIG. 4 illustrates a power semiconductor device according to further embodiments.

According to embodiments described herein, the semiconductor wafer 101 can be removed at least partially after forming the epitaxy layer 110 (see e.g. FIG. 4). Specifically, the semiconductor wafer 101 can be removed after forming the pn-junction. For instance, the semiconductor wafer 101 can be removed by etching the material of the semiconductor wafer 101. The removal of the semiconductor wafer 101 can be considered as being part of and/or start of the BEOL processing. The BEOL processing can include several processing operations, such as forming the second metallization. In particular, BEOL processing can include several processing operations that are performed from the second site of the semiconductor wafer 101.

According to embodiments described herein, the semiconductor wafer 101 can be removed to such an extent that the substrate doping layer 105 is exposed. Accordingly, the exposed substrate doping layer 105 may be part of the power semiconductor device 100. For example, the substrate doping layer 105 may function as a high conductivity layer of the power semiconductor device 100. Further, the substrate doping layer 105 may be accessible for further processing operations. For example, a metal layer can be formed on the exposed substrate doping layer 105. Additionally or alternatively, the exposed substrate doping layer 105 can be structured and/or patterned.

Alternatively, the semiconductor wafer 101 can be removed completely or substantially completely. In particular, the semiconductor wafer 101 can be removed to such an extent that the dopant layer 115 is exposed. Accordingly, the exposed dopant layer 115 may be accessible for further processing operations. For example, a metal layer can be formed on the exposed dopant layer 115. Additionally or alternatively, the exposed dopant layer 115 can be structured and/or patterned from the first side 101a.

Figure 5A:
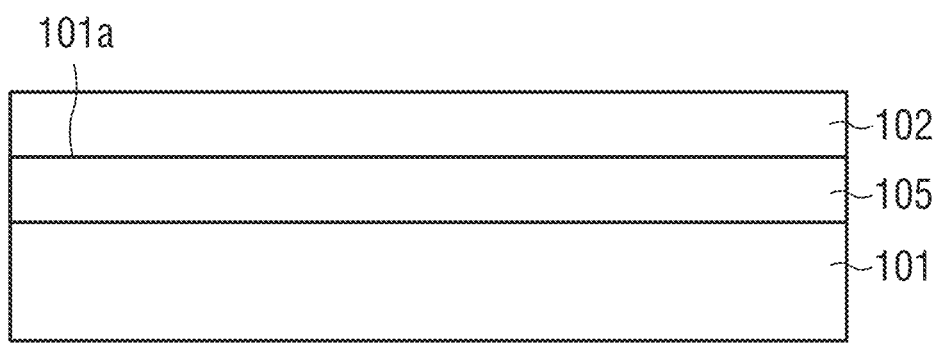
FIGS. 5A and 5B illustrate, in a cross-sectional view of a semiconductor substrate, further processes according to embodiments.

FIG. 5A illustrates forming a glass layer 102 for forming the substrate doping layer 105.

According to embodiments described herein, a glass layer 102 can be formed on the first side 101a of the semiconductor wafer 101. The glass layer 102 can include dopants. Specifically, the glass layer 102 can include dopants of the first conductivity type. In particular, the glass layer 102 can include phosphorus. Further, the semiconductor wafer 101 can be subjected to a thermal treatment. The thermal treatment can drive the dopants into the semiconductor wafer 101, thus forming the substrate doping layer 105.

According to embodiments described herein, the semiconductor wafer 101 is subjected at elevated temperature to an oxidizing gas atmosphere containing a gaseous dopant precursor to form the glass layer 102. For instance, the dopant precursor can include phosphine ($PH_3$).

The elevated temperature can be equal to or greater than 750° C., specifically equal to or greater than 900° C., particularly equal to or greater than 1000° C., and/or equal to or smaller than 1450° C., specifically equal to or smaller than 1300° C., particularly equal to or smaller than 1200° C. According to embodiments described herein, the glass layer 102 can be formed at a temperature of equal to or greater than 750° C., specifically equal to or greater than 900° C., particularly equal to or greater than 1000° C., and/or equal to or smaller than 1450° C., specifically equal to or smaller than 1300° C., particularly equal to or smaller than 1200° C.

The semiconductor wafer 101 can be subjected to the elevated temperature and/or oxidizing gas atmosphere for equal to or greater than 120 min, specifically equal to or greater than 180 min, particularly equal to or greater than 210 min, and/or equal to or smaller than 360 min, specifically equal to or smaller than 300 min, particularly equal to or smaller than 270 min.

According to embodiments described herein, the glass layer 102 can be removed prior to subjecting the semiconductor wafer 101 to the thermal treatment.

According to embodiments described herein, the thermal treatment to drive the dopants into the semiconductor wafer 101 can be carried out at a temperature of equal to or greater than 800° C., specifically equal to or greater than 900° C., specifically equal to or greater than 1000° C., particularly equal to or greater than 1100° C., specifically equal to or smaller than 1400° C., particularly equal to or smaller than 1300° C.

The semiconductor wafer 101 can be subjected to the thermal treatment to drive the dopants into the semiconductor wafer 101 for equal to or greater than 60 min, specifically equal to or greater than 90 min, particularly equal to or greater than 110 min, and/or equal to or smaller than 180 min, specifically equal to or smaller than 150 min, particularly equal to or smaller than 130 min.

According to embodiments described herein, the substrate doping layer 105 can have a thickness of equal to or greater than 5 µm, specifically equal to or greater than 10 µm, particularly equal to or greater than 15 µm, and/or equal to or smaller than 30 µm, specifically equal to or smaller than 25 µm, particularly equal to or smaller than 20 µm.

Further, the substrate doping layer 105 can have a doping concentration of at least $10^{17}/cm^3$, specifically of at least $10^{18}/cm^3$, particular $10^{19}/cm^3$. Also very high doping concentrations of $10^{20}/cm^3$ or even more can be obtained. Doping concentrations can be measured by Spreading Resistance Profiling (SRP) and/or Secondary Ion Mass Spectroscopy (SIMS) analysis. In particular, the process parameters for forming the substrate doping layer 105 can be optimized so that the doping concentration is on the one hand high enough to ensure diffusion of a certain amount of dopants into the epitaxy layer 110. On the other hand, the process parameters for forming the substrate doping layer 105 can be optimized so that the doping concentration in the substrate doping layer 105 is not too high, e.g. goes into saturation, which may lead to a deformation of the lattice of the semiconductor wafer 101 and thus to a worsen growing of the epitaxy layer 110 on the semiconductor wafer 101.

Figure 5B:
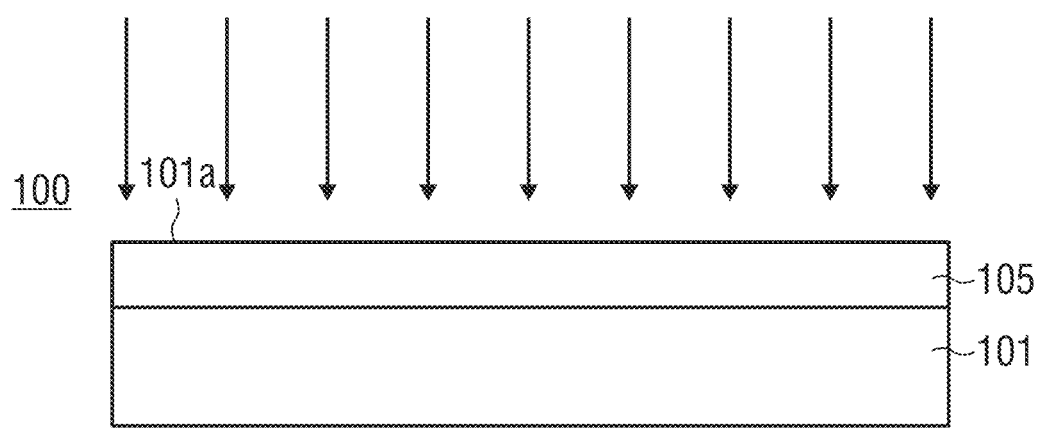

FIG. 5B illustrates for forming the substrate doping layer 105 by implantation.

According to embodiments described herein, dopants can be implanted into the first side 101a of the semiconductor wafer 101. The semiconductor wafer 101 can be subjected to a thermal treatment to drive the dopants into the semiconductor wafer 101, thus forming the substrate doping layer 105. For instance, the dopants can include n-type dopants such as phosphorus.

According to embodiments described herein, the dopants are implanted with a dose of at least $10^{14}/cm^2$, specifically of at least $5 \cdot 10^{14}/cm^2$, particularly of at least $10^{15}/cm^2$.

According to embodiments described herein, the thermal treatment to drive the dopants into the semiconductor wafer 101 can be carried out at a temperature of equal to or greater than 800° C., specifically equal to or greater than 900° C., specifically equal to or greater than 1000° C., particularly equal to or greater than 1100° C., and/or equal to or smaller than 1400° C., specifically equal to or smaller than 1300° C., particularly equal to or smaller than 1200° C.

According to embodiments described herein, the thermal treatment to drive the dopants into the semiconductor wafer 101 can be carried out for equal to or greater than 100 min, particularly for equal to or greater than 400 min, particularly for equal to or greater than 700 min, specifically equal to or greater than 900 min, particularly equal to or greater than 1000 min, and/or equal to or smaller than 1500 min, specifically equal to or smaller than 1300 min, particularly equal to or smaller than 1200 min. According to embodiments described herein, the higher the temperature can be the lower the diffusion time can be made. Accordingly, a rather short diffusion time can be compensated by a high temperature and vice versa.

When practicing embodiments, a doping concentration at the first side 101a of the conductive wafer 101 of about e.g. 1.5·10$^{19}$ cm$^{-3}$ can be obtained. The thickness of the substrate doping layer 105 can be similar or equal to the thickness obtained by the process including the glass layer 102 and describes with reference to FIG. 5A. In contrast to the process described with reference to FIG. 5A, the implanted dopants are activated electrically and the obtainable doping concentration is below the top values described for the glass layer process. In particular, the doping concentration of the implementation process normally results in a doping concentration below saturation level. Hence, no deformation of the lattice occurs.

Figure 6A:
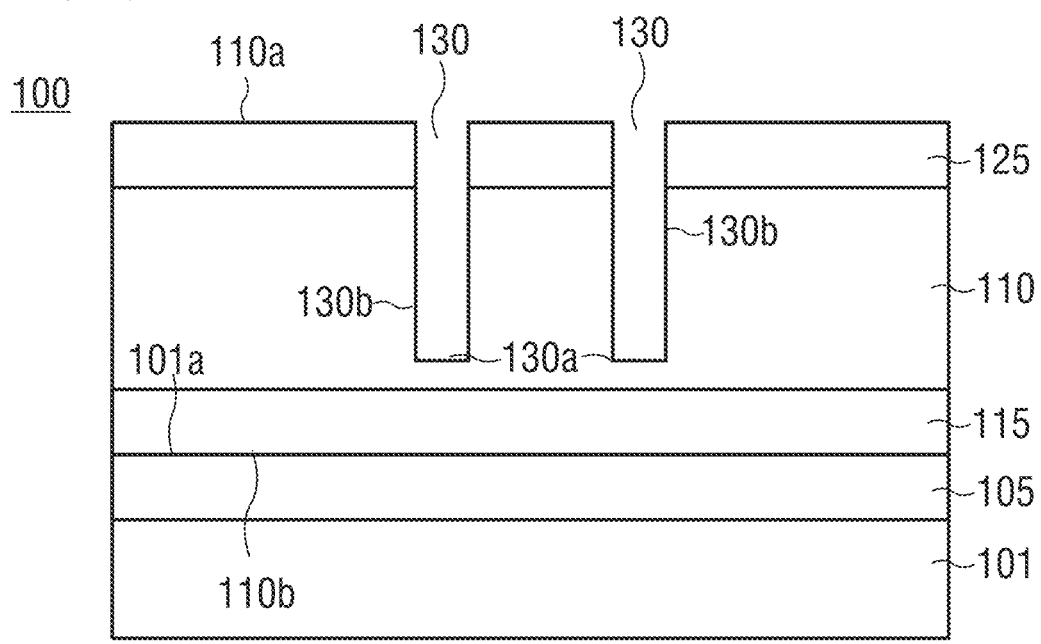
Figure 6B:
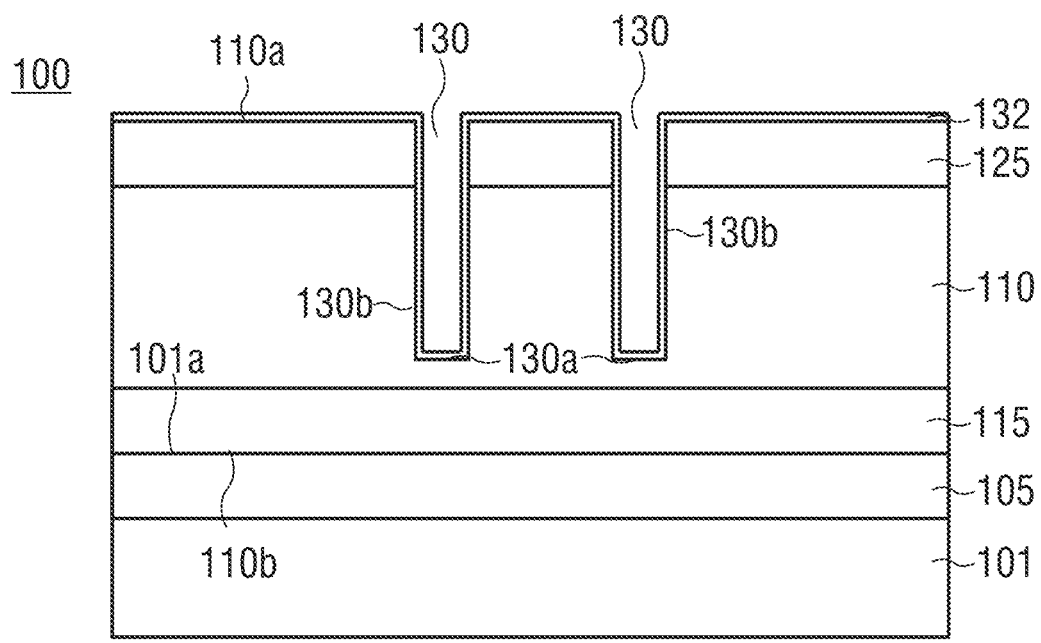

FIGS. 6A to 6C shows further FEOL processes. In particular, the FEOL processes can be performed while the substrate wafer 101 is attached to the epitaxy layer 110.

According to embodiments described herein, a trench 130 can be formed in the epitaxy layer 110 (see e.g. FIG. 6A). The trench 130 can include a sidewall 130b and a bottom 130a. The sidewall 130b can be considered as the circumferential surface that is substantially parallel to a direction spanning from the first side 110a to the second side 110b of epitaxy layer 110, i.e. an up-down direction. A dimensional extension of the sidewall 130b in the up-down direction can be considered as a depth of the trench 130. The bottom 130a can be considered as the surface of the trench 130 that is substantially perpendicular to the sidewall 130b. A dimensional extension of the bottom 130a along the direction substantially perpendicular to the up-down direction can be considered as a width of the trench 130.

Without being limited thereto, the trench 130 can be formed, e.g. by forming a hard mask (not shown) or photoresist (not shown) on the epitaxy layer 110, specifically on the first side 110a of the epitaxy layer 110. For instance, the hard mask can be formed by depositing an inorganic material such as an oxide. An example is depositing TEOS (Tetraethyl Orthosilicate). A photoresist can be deposited on the deposited inorganic material. A portion of the photoresist corresponding to the location of trench 130 to be formed can be removed by photolithographic techniques, exposing a portion of the deposited material that corresponds to the location of the trench 130. Accordingly, the portion of the deposited material corresponding to the trench 130 can be removed, e.g., by etching, to form the hard mask. Thereafter, the photoresist can be removed. The trench 130 can be formed by etching the epitaxy layer 110 using the hard mask as an etching mask. According to embodiments described herein, the trench 130 can be formed to have an aspect ratio of the depth to smallest lateral extension of at least 2:1, particularly of at least 4:1.

As shown in FIG. 6A, more than one trench 130 can be formed in the epitaxy layer 110. In particular, at least one trench 130 can be formed in the epitaxy layer 110. Specifically plurality of trenches 130 can be formed in the epitaxy layer 110. Accordingly, unless stated otherwise, features that are described with respect to a trench 130 can be part of all trenches 130 in the case of more than one trench 130.

As shown in FIG. 6B, an auxiliary layer 132 can be formed on the sidewall 130b and the bottom 130a of the trench 130. For instance, the auxiliary layer 132 can be an insulation layer 132. Further the auxiliary layer 132 can include several sub layers, such as a first auxiliary layer, second auxiliary layer, a third auxiliary layer etc. The sub layers of the auxiliary layer 132 can be made of different materials. The sub layers of the auxiliary layer 132 can be formed similar to each other.

The auxiliary layer 132 can be formed by depositing an auxiliary material on the epitaxy layer 110 and/or in the trench 130, specifically so as to cover the bottom 130b of the trench 130 and can extend from the bottom 130a of the trench 130 along the sidewalls 130b of the trench 130 to the first side 110a of the epitaxy layer 110. For instance, the auxiliary material can be deposited by CVD (chemical vapour deposition), HTO CVD (high temperature oxide CVD), HDP CVD (high-density plasma chemical vapour deposition), TEOS (Tetraethyl Orthosilicate) deposition, or PSG (phosphosilicate glass) deposition, or BPSG (borophosphosilicate glass) deposition. The auxiliary material can be an oxide, such as silicon oxide, silicon dioxide, hafnium oxide and zirconium oxide. Further, the auxiliary material can be a combination of an oxidized and deposited oxide, such as silicon dioxide.

As shown in FIG. 6C, a filling material 4 can be deposited on the auxiliary layer 132 to at least partially fill the trench 130. For instance, the filling material 140 can be a conductive material 140. Specifically, the conductive material 140 can be a metal composition or doped, e.g. phosphorus doped, or undoped polycrystalline semiconductor material, such as poly-Si, doped amorphous silicon, tungsten silicide, refractory metal silicide, titanium nitride, refractory metal, and/or combinations thereof.

FIG. 7 illustrates a method 300 for forming a power semiconductor device 100. In block 310, a semiconductor wafer, such as the semiconductor wafer 101, grown by a Czochralski process and having a first side 101a can be provided. In block 320, an n-type substrate doping layer, such as the substrate doping layer 105, can be formed in the semiconductor wafer at the first side. The substrate doping layer can have a doping concentration of at least 10$^{17}$/cm$^{3}$, typically of at least 10$^{18}$/cm. In block 330, an epitaxy layer, such as the epitaxy layer 110, can be formed on the first side of the semiconductor wafer after forming the substrate doping layer.

Figures 8A, 8B:
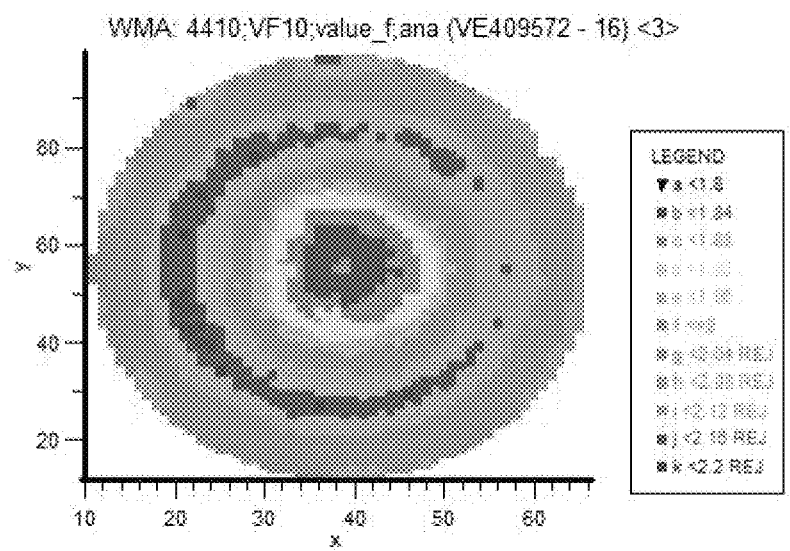
FIGS. 8A and 8B illustrate 2D graphs of two forward voltage measurements.

FIGS. 8A and 8B illustrate 2D graphs of two forward voltage measurements performed for two different conventional 1200V free-wheeling diodes that are formed using different semiconductor wafers as carrier. Specifically, for the diode of FIG. 8A a semiconductor wafer grown by a Czochralski process is used while for the diode of FIG. 8B a semiconductor wafer grown by a magnetic Czochralski process is used while. As outlined herein, these semiconductor wafers can be different in terms of their oxygen concentration. In particular, the semiconductor wafer grown by a magnetic Czochralski process of FIG. 8B can have a lower oxygen concentration than the semiconductor wafer grown by a Czochralski process of FIG. 8A. As can be seen from FIGS. 8A and 8B the drop of the forward voltage varies greatly over the surface of the conventional free-wheeling diodes. The semiconductor wafer is normally removed by etching during BEOL processing. However, the etching may normally not be totally homogeneous, leading to a different remaining thickness of the semiconductor wafer or the layer formed on the semiconductor wafer. As the material of the semiconductor wafer and/or the layer formed on the semiconductor wafer has normally a comparably low conductivity, the resistivity of the power semiconductor device along the up-down direction will depend on the remaining amount of the material of the semiconductor wafer or the layer formed on the semiconductor wafer, leading to the inhomogeneous distribution of the drop of the forward voltage shown in FIGS. 8A and 8B. A difference of the drop of the forward voltage between FIGS. 8A and 8B can be due to a different oxygen concentration and/or oxygen diffusion out of the semiconductor wafers. As outlined above, the the semiconductor wafer grown by a magnetic Czochralski process of FIG. 8B can have a lower oxygen concentration than the semiconductor wafer grown by a Czochralski process of FIG. 8A hence, having a different characteristic of the drop of the forward voltage.

According to embodiments described herein, the dopant layer 115 and/or the substrate doping layer 105 can provide a high conductivity margin during at least partial removal of the semiconductor wafer 101. Specifically, the dopant layer 115 and/or the substrate doping layer 105 can have a comparably high conductivity. Accordingly, when the dopant layer 115 and/or the substrate doping layer 105 are inhomogeneously removed, the impact on the on-state resistance (forward voltage drop Vf) of the power semiconductor device 100 in the up-down direction is low. When practicing embodiments, a power semiconductor device 100 can be provided having an improved, in particular homogeneous, forward voltage distribution.

Among BEOL processes, one may distinguish between long thin wafer processes and short thin wafer processes. In case of long thin wafer processes, high temperature processes for the backside of the wafer, such as emitter anneal, and field stop anneal and/or Pt (platinum) diffusion for setting carrier lifetime, are performed when the wafer is in a thin state, i.e. when the semiconductor wafer 101 is at least partially removed. In case of short thin wafer processes, the high temperature processes, in particular all high temperature processes, are performed in an unthinned state, i.e. before the semiconductor wafer 101 is at least partially removed. A doping on the backside can be performed by "cold" processes. For instance, the field stop can be formed by proton irradiation and/or the backside emitter can be formed by ion implantation and laser annealing. Thereby, it can be assured that the front side of the wafer is not exposed to a critical temperature (for example above 400° C.).

As handling issues during the processes in the thinned state can be yield limiting with increasing wafer size, e.g. wafer diameter, even for the short thin wafer processes, a stabilising ring can be left at the peripheral portion of the wafer, in particular for wafers having a wafer diameter of greater than 200 mm. Forming of the stabilising ring can be performed as follows. The wafer can be thinned to an intended height of the stabilising ring. Further, the material of the wafer can be removed to a certain thickness, e.g. of 650 μm, by e.g. grinding. Thereafter, the remaining material of the wafer can etched to remove crystal defects arising from the grinding process. In contrast to processes removing the material of the wafer from the entire surface, as they are typically performed for wafers having a diameter of up to 150 mm, thinning of a wafer having a larger diameter is performed by a non-uniform grinding process. For instance, a pot-like recess can be formed in the wafer such that a stabilising ring (a so called TAIKO ring) can remain for stabilising during handling. However, the topology formed thereby may increase or interfere an outflow speed of an etchant during etching depending on an angle of the topology. Etching can be performed as spin-etch process, for which the wafer can be set in rotation. The topology or geometry of the stabilising ring may deteriorate a laminar outflow of the etchant such that the etching amount increases or decreases close the stabilising ring. Consequently, the wafers may systematically have a higher or lower wafer thickness close to the stabilising ring as compared to a center of the wafer.

The resulting thickness variation may be in the range of 5 to 10 μm. The thickness variation may have an impact on the electrical properties of e.g. a 600 V diode. The diode may be specified for a thickness of 65 μm. A specific resistivity of the base material of the wafer can be 30 Ωcm. When reaching an avalanche voltage $V_R$ of about 770 V an electric filed strength at the nn$^+$ junction of the base zone to the field stop can be almost 100 kV/cm. Accordingly, an increase of the wafer thickness of about 9 to 10 μm may be accountable for the measured variation of a break through voltage of 90 V. This can be confirmed by measuring a thickness variation between the center of the wafer and a peripheral portion of the wafer. A corresponding variation of in the forward voltage drop Vf may be 300 mV. Compared to an intended forward voltage drop Vf this may correspond to an increase of 20%. Along with YB-losses (YB may be understood as a yield when electrically benchmarking in wafer testing) in the ongoing production, current processes limit development of thin semiconductor devices, e.g. having a wafer device thickness of 40 μm or smaller.

Further, the processes for forming structures on the back side of the wafer may be limited in terms of their thermal budget. Accordingly, a back side emitter may only be formed with a small depth of penetration. For instance, a boron implantation for an p-type emitter of an IGBT (at a dose of $1.3 \cdot 10^{13}$ cm$^{-2}$ at an energy of 45 keV and an anneal of 880° C. for 30 min) or phosphorus implantation of a cathode emitter of a diode (at a dose of $1.1 \cdot 10^{15}$ cm$^{-2}$ at an energy of 45 keV and simultaneous activation by Pt diffusion at 854° C. for 2 hours) may result in a depth of penetration of less than 1 μm.

Compared to a lateral dimension of the field stop and the drift zone, the back side emitter formed by the processes describes just above are infinitesimal thin. The thickness of these layers can be determined, e.g. by Spreading Resistance Profiling.

As the variation of the electrical parameters thus mainly result from the variation in base thickness, a back side emitter having a higher thickness and being highly doped may be formed in order to compensate for the variation of the electrical parameters resulting from a variation in thickness of a material having a comparable low specific resistivity. According to embodiments describes herein, the dopant layer 115 and/or the substrate doping layer 105 can provide a high conductivity margin. According to embodiments described herein, the dopant layer 115 and/or the substrate doping layer 105 can have a thickness of at least 10% of a base thickness, e.g., for a 600 V diode. According to embodiments described herein, the dopant layer 115 and/or the substrate doping layer 105 can have a thickness of equal to or more than 3 μm, specifically equal to or more than 5 μm, particularly equal to or more than 6 μm. Further, the base thickness may be kept constant or unchanged. By using the epitaxy process described herein, further degrees of freedom may be obtained for the formation of the doping gradient of the filed stop and the base zone.

Without being bond by theory, a current-voltage characteristic of a pin diode with reduced emitter efficiency as well as of an emitter controlled diode can be approximated by:

$$j = q \cdot \left(\frac{\mu_n + \mu_p}{w_B}\right)^2 \cdot \frac{(U_F - U_j)}{H} \cdot [(U_F - U_j) - U_H]$$

With j being the current density, q the elementary charge, $\mu_n$ and $\mu_p$ the mobility of the electrons and holes, respectively, $U_F$ the flux voltage, Uj the voltage drop in the boundary zones, and $U_H$ the voltage drop in the center zone.

The voltage drop in the center zone can be determined by the high injection lifetime $\tau_{HL}$. $U_H$ can be determined by:

$$U_H = \frac{w_B^2}{(\mu_n + \mu_p) \cdot \tau_{HL}}$$

With $w_B$ being the base width. This designation can also be used for describing an IGBT current-voltage characteristic in a fully controlled state, as the IGBT forward characteristics are mainly determined by the emitter.

A good accordance with the measurement can be obtained, e.g. for current densities of 30 A/cm² or higher, what may correspond to a tenth of a rated current density of 600 V EC diodes.

Taken the above into account, a current-voltage characteristic for a diode having a device thickness of 65 μm can be calculated for different boundary conditions. The current density can be 260 A/cm2, a corresponding voltage drop at a rated current can be measured during final testing and denoted as $V_F$. A typical value can be 1.55 V.

Without lifetime killing, i.e. for a device without Pt diffusion, $\tau_{HL}$ can be approximately 5 μs. This value takes account of recombination in the emitter zone. The mobility $\mu_n$ and $\mu_p$ can be 1400 cm²/Vs. By respective adjustment of the lifetime and the factor H, the forward characteristics can be calculated such that they approximate experimental verified $V_F$ values. To this end, the experimentally obtained values for Pt diffused devices having a thickness of 65 μm and 75 μm may be taken into account.

The following values may be fitted: $\tau_{HL}$=40 ns, a corresponding ambipolar diffusion length of app. 11 μm and H=5.5·10⁻¹² cm⁻⁴/s. The $V_F$ value of a diode without Pt ($\tau_{HL}$=5 μs) would be calculated to 1.05 V, what could be experimentally verified too.

A current-voltage characteristic for an IGBT having a device thickness of 70 μm can be calculated too. As a forward value of an IGBT can be normally adjusted by emitter efficiency, $\tau_{HL}$=5 μs is assumed. An experimentally obtained VCESAT value of 1.6 V can be obtained at a rated current density of 200 A/cm². A value of H=3.2·10⁻¹¹ cm⁻⁴/s can be fitted.

Following Ohm's law, a lead resistance of the emitter zone can be calculated by:

$$j = q \cdot n \cdot \mu(N_D) \cdot E$$

Under the assumption that no significant recombination of minority charge carriers takes place in the emitter zone, n≈$N_D$ can be assumed. This assumption may be justified by a numerical simulation of the stationary forward state of an EC diode as outlined above. A hole current can be totally reduced with a distance of 300 nm from the start of a n⁺-zone. That may almost correspond to a depth of a common emitter zone. The hole density may start from a similar value as the electrode concentration and may be in an order of 5·10¹⁶ cm⁻³. The electrode concentration may rise rapidly and reach a value determined by the doping of the emitter.

The reduction of the minority current in the emitter being over a distance that is much smaller than the ambipolar diffusion length (which determines reduction in the base zone) may arise from additional recombination mechanism in an area of high dopant concentration. While a concentration of recombination centers (such as substitutional platinum) may be the dominating value in the base zone (cf. Shockley-Read-Hall statistic) mutual interdependencies with donators and acceptors, respectively, (cf. Scharfetter relation) and Auger recombination may play a significant role.

Except of a transition zone, the voltage contribution of which may already be included in $V_F$, the additional voltage drop Un in the path zone may be for a thick cathode emitter (>>300 nm) having dimension d:

$$U_n \approx \frac{j \cdot d}{q \cdot N_D \cdot \mu(N_d)},$$

respectively for a backside p-type emitter of an IGBT $$U_p \approx \frac{j \cdot d}{q \cdot N_A \cdot \mu(N_A)}.$$

Taken these relations into account, a respective voltage drop in the emitter zones at rated current could be calculated. Here, a dependency of the mobility on the doping may be taken into account. For a diode emitter having $N_D$=10²⁰ cm⁻³, $\mu_n$=78 cm²/Vs may be obtained. For a p-type emitter of an IGBT having $N_A$=6·10¹⁷ cm⁻³, $\mu_p$=185 cm²/Vs may be obtained.

By increasing the device thickness starting from a target value of 65 μm for the diode and 70 μm for the IGBT, an increase in VF and VCESAT may be calculated for variations of the base thickness and the emitter thickness. While an improvement of the VF variation of three orders in magnitude may be obtained for the diode by relocating the thickness variation in the emitter zone, an improvement of one order in magnitude may be obtained for the IGBT.

Figure 9:
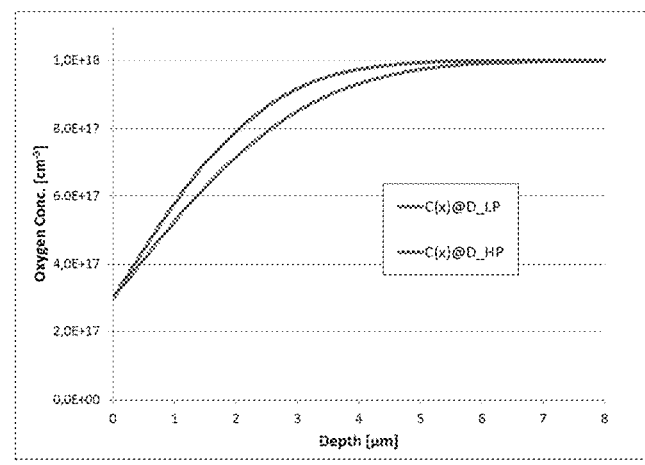
FIG. 9 illustrates a simulation graph of the oxygen concentration in a semiconductor wafer after growing an epitaxy layer on the semiconductor wafer.

FIG. 9 illustrates a simulation graph of the oxygen concentration in the semiconductor wafer 101 after growing the epitaxy layer 110 on the semiconductor wafer 201. In FIG. 9, the right axis represents the depth [μm] into the semiconductor wafer 201 from the first side 101a and the left axis represents the oxygen concentration [cm⁻³]. Specifically, FIG. 9 shows the remaining oxygen in the semiconductor wafer 201 after growing the epitaxy layer 110 on the semiconductor wafer 201. Assuming a constant bulk oxygen concentration of 10¹⁸ cm⁻³ (the asymptote for high depth values), the amount of oxygen diffused into the epitaxy layer 110 is the area between a straight line representing the bulk value of 10¹⁸ cm⁻³ and the respective graph.

FIG. 9 shows two graphs: one for a semiconductor wafer 201 having a substrate doping layer 105 with a high dopant concentration (C(x)@D_HP; upper line), and one for a semiconductor wafer 201 having a substrate doping layer 105 with a low dopant concentration (C(x)@D_LP; lower line). In the context of FIG. 9, "high dopant concentration" and "low dopant concentration" can be understood as meaning a higher dopant concentration as the other one and a lower dopant concentration as the other one, respectively. In both cases, a temperature of 1100° C. for 50 min was assumed the substrate for forming the substrate doping layer 105.

As can be seen from FIG. 9, the remaining oxygen concentration in the semiconductor wafer 101 depends on the dopant concentration. In particular, for a high dopant concentration, more oxygen will remain in the semiconductor wafer 101. Accordingly, less oxygen diffuses into the epitaxy layer 110 and hence the epitaxy layer will have a lower oxygen concentration. Specifically, in case of the low dopant concentration, and oxygen dose or amount of about $1.5 \cdot 10^{14}$ cm$^{-2}$ diffuses from the semiconductor wafer 101 into the epitaxy layer 110. In case of the high dopant concentration (about $1 \cdot 10^{19}$ cm$^{-3}$), the oxygen diffusion was reduced, so that the oxygen does or amount diffused into the epitaxy layer 110 is lowered by about 20%.

Figure 10A:
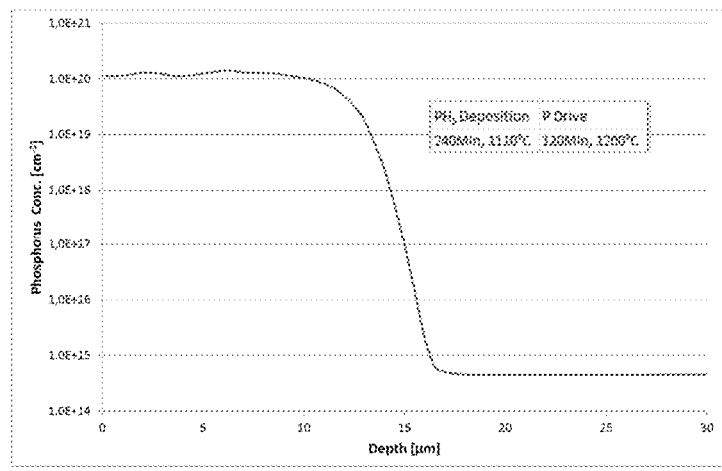
FIGS. 10A and 10B illustrate graphs showing the dopant concentration of a substrate doping layer.

FIG. 10A illustrates a graph showing the dopant concentration of a substrate doping layer formed by a glass layer 102. The formation of the substrate doping layer 105 is carried out by a subjecting the semiconductor wafer 101 at an elevated temperature of 1110° C. for 240 min to an oxidizing gas atmosphere containing a phosphine (PH$_3$) precursor. Thereafter, the semiconductor wafer 101 was subjected to a thermal treatment at a temperature of 1200° C. for 120 min to drive the dopants into the semiconductor wafer 101.

As can be seen from FIG. 10a, a substantially constant phosphorus concentration of $10^{20}$ cm$^{-3}$ can be obtained over a depth of about 15 μm. At the depth of about 15 μm, the phosphorus concentration rapidly falls to a lower value of less than $10^{15}$ cm$^{-3}$. Accordingly, the substrate doping layer can be considered as having a thickness of 15 μm in this example.

Figure 10B:
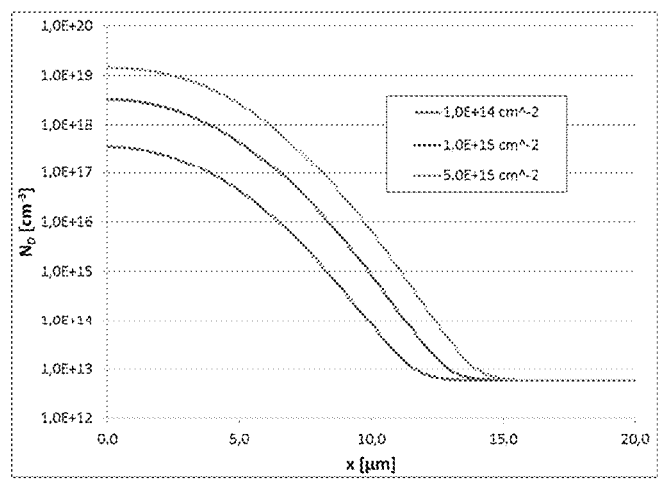

FIG. 10B illustrates graphs showing the dopant concentration of a substrate doping layer formed implantation. For the three graphs in FIG. 10B, the formation of the substrate doping layer 105 is carried out by implanting phosphorus at different doses. For the uppermost graph, a dose of $5 \cdot 10^{15}$ cm$^{-2}$ was applied. For the middle graph, a dose of $10^{15}$ cm$^{-2}$ was applied. For the lowermost graph, a dose of $10^{14}$ cm$^{-2}$ was applied. Further, the semiconductor wafer 101 was subjected to a thermal treatment at a temperature of 1150° C. for 1100 min to drive the dopants into the semiconductor wafer 101.

Figure 11:
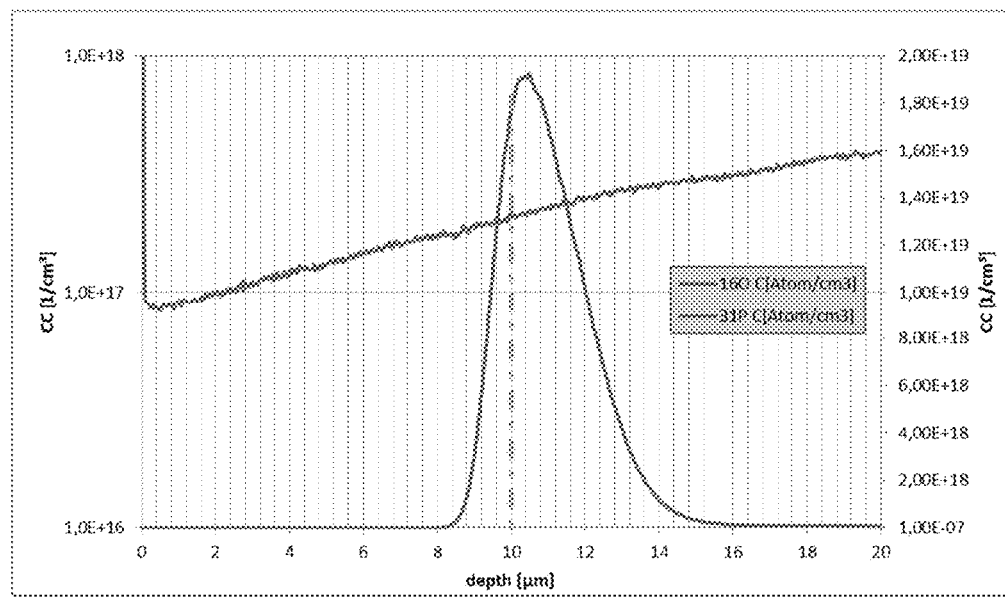
FIG. 11 illustrates graphs showing concentration profiles for an implanted phosphorus concentration and oxygen concentration.

FIG. 11 illustrates graphs showing experimentally verified concentration profiles for the implanted phosphorus concentration (31P C[Atom/cm3]; the graph with the peak around 10 to 11 μm depth) and the oxygen concentration (16O C[Atom/cm3]; the graph decaying from right to left), respectively. The implanted phosphorus dose was about $5 \cdot 10^{15}$ cm$^{-2}$ and a thermal treatment of 1150° C. for 400 min was applied. Thereafter, an epitaxy layer 110 having a thickness of about 100 μm was grown on the semiconductor wafer 101. The interface between the second side 10b of the epitaxy layer 110 and the first side 101a of the semiconductor wafer 101 is represented by the vertical dashed line at a depth of 10 μm. the epitaxy layer 110 is left of the vertical dashed line and the semiconductor wafer 101 is right of the left line.

As can be seen from FIG. 11, the oxygen concentration declines exponentially from the bulk value within the semiconductor wafer 101 to the first side 101a of the semiconductor wafer 101, and from the second side 110b of the epitaxy layer 110 into the epitaxy layer 110 to a value of below $10^{17}$ cm$^{-3}$. The implanted phosphorus concentration has its peak value within the semiconductor wafer 101. As can be seen in comparison to FIG. 10B, the implanted phosphorus concentration has its maximum value at the first side 101a of the semiconductor wafer 101. Accordingly, the phosphorus dose on the left side of the vertical dashed line is diffused out of the semiconductor wafer 101 into the epitaxy layer 110 (see also FIG. 9). When practicing embodiments, the amount of oxygen diffusing into the epitaxy layer can be reduced and/or a dopant layer can be formed in the epitaxy layer 110.

Figure 12:
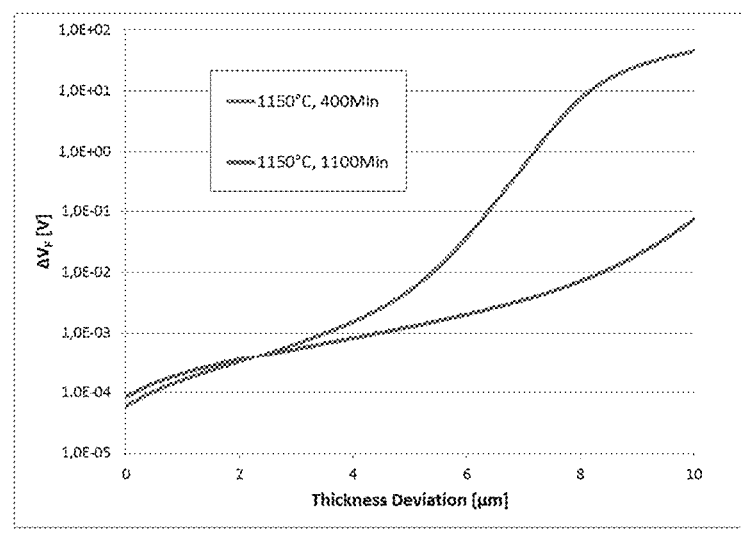
FIG. 12 illustrates graphs showing a change in the forward voltage drop.

FIG. 12 illustrates graphs showing a change in the forward voltage drop ($\Delta V_F$ [V]) in dependence on a thickness variation [μm] in the process of at least partially removing the semiconductor wafer 101. FIG. 12 shows two graphs: one for a thermal treatment at 1150° C. for 400 min (the graph having the higher value at 10 μm), and one for a thermal treatment at 1150° C. for 1100 min (the graph having the lower value at 10 μm). For both graphs phosphorus was implanted at a dose of $5 \cdot 10^{15}$ cm$^{-2}$.

As can be seen from FIG. 12, the dependence of the change in the forward voltage drop can be reduced by two magnitudes by forming different substrate doping layers 105. The dependence of the change in the forward voltage drop on the thickness variation of the remaining portion of the semiconductor wafer 101 can even be further lowered as compared to a semiconductor wafer in which no substrate doping layer is formed. When practicing embodiments, a power semiconductor device 100 can be provided that has an improved forward voltage drop homogeneity.

As used herein, the terms "having". "containing" "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for forming a power semiconductor device, the method comprising:
    providing a semiconductor wafer grown by a Czochralski process and having a first side;
    forming an n-type substrate doping layer in the semiconductor wafer at the first side, the n-type substrate doping layer having a doping concentration of at least $10^{17}$/cm$^3$; and
    forming an epitaxy layer on the first side of the semiconductor wafer after forming the n-type substrate doping layer.

2. The method of claim 1, further comprising:
    forming a pn-junction in the epitaxy layer.

3. The method of claim 1, further comprising:
    forming a first metallization on the epitaxy layer; and
    forming a second metallization on a second side of the semiconductor wafer opposite to the first side.

4. The method of claim 1, wherein forming the n-type substrate doping layer comprises:
    forming a glass layer on the first side of the semiconductor wafer, the glass layer comprising dopants; and
    subjecting the semiconductor wafer to a thermal treatment to drive the dopants into the semiconductor wafer to form the n-type substrate doping layer.

5. The method of claim 4, wherein forming the glass layer on the first side of the semiconductor wafer comprises:
    subjecting the semiconductor wafer at elevated temperature to an oxidizing gas atmosphere containing a gaseous dopant precursor.

6. The method of claim 4, wherein the glass layer is formed at a temperature of equal to or greater than 750° C. and/or equal to or smaller than 1400° C.

7. The method of claim 4, further comprising:
    removing the glass layer prior to subjecting the semiconductor wafer to the thermal treatment.

8. The method of claim 4, wherein the thermal treatment to drive the dopants into the semiconductor wafer is carried out at a temperature of equal to or greater than 800° C. and/or equal to or smaller than 1600° C.

9. The method of claim 1, wherein forming the n-type substrate doping layer comprises:
implanting dopants into the first side of the semiconductor wafer; and
subjecting the semiconductor wafer to a thermal treatment to drive the dopants into the semiconductor wafer to form the n-type substrate doping layer.

10. The method of claim 9, wherein the dopants are implanted with a dose of at least $10^{14}/cm^2$.

11. The method of claim 9, wherein the dopants contain phosphorus.

12. The method of claim 1, further comprising:
removing the semiconductor wafer at least partially after forming the epitaxy layer.

13. The method of claim 12, wherein the semiconductor wafer is removed to such an extent that the n-type substrate doping layer is exposed.

14. The method of claim 13, further comprising:
forming a metal layer on the exposed n-type substrate doping layer.

15. The method of claim 1, wherein an n-type dopant layer is formed in the epitaxy layer during growth of the epitaxy layer by diffusion of dopants of the n-type substrate doping layer into the epitaxy layer.

16. The method of claim 15, wherein the n-type dopant layer has a thickness of equal to or more than 0.5 μm.

17. The method of claim 15, wherein the n-type dopant layer has a higher doping concentration than an adjacent portion of the epitaxy layer.

18. The method of claim 15, wherein the n-type dopant layer provides a high conductivity margin during at least partial removal of the semiconductor wafer.

19. The method of claim 1, further comprising:
etching a trench having a sidewall and a bottom into the epitaxy layer;
forming an auxiliary layer on the sidewall and the bottom of the trench; and
depositing a conductive material on the auxiliary layer to at least partially fill the trench.

* * * * *